(12) United States Patent
Liukku et al.

(10) Patent No.: US 9,547,020 B2
(45) Date of Patent: Jan. 17, 2017

(54) CAPACITIVE MICROMECHANICAL SENSOR STRUCTURE AND MICROMECHANICAL ACCELEROMETER

(71) Applicant: MURATA MANUFACTURING CO., LTD., Nagaokakyo-shi, Kyoto (JP)

(72) Inventors: Matti Liukku, Helsinki (FI); Ville Pekka Rytkönen, Klaukkala (FI)

(73) Assignee: MURATA MANUFACTURING CO., LTD., Nagaokakyo-Shi, Kyoto (JP)

( * ) Notice: Subject to any disclaimer, the term of this patent is extended or adjusted under 35 U.S.C. 154(b) by 234 days.

(21) Appl. No.: 14/314,243

(22) Filed: Jun. 25, 2014

(65) Prior Publication Data
US 2015/0316581 A1  Nov. 5, 2015

(30) Foreign Application Priority Data
Jun. 28, 2013  (FI) .................................... 20135712

(51) Int. Cl.
*G01P 15/125* (2006.01)
*B81B 3/00* (2006.01)
*G01P 15/18* (2013.01)
*G01P 15/13* (2006.01)
*G01P 15/08* (2006.01)

(52) U.S. Cl.
CPC .......... *G01P 15/125* (2013.01); *B81B 3/0078* (2013.01); *B81B 2201/0235* (2013.01); *B81B 2201/033* (2013.01); *G01P 15/0802* (2013.01); *G01P 15/131* (2013.01); *G01P 15/18* (2013.01); *G01P 2015/0814* (2013.01); *G01P 2015/0871* (2013.01)

(58) Field of Classification Search
CPC .................................................... G01P 15/125

USPC ....................................................... 73/514.32
See application file for complete search history.

(56) References Cited

U.S. PATENT DOCUMENTS 6,520,017 B1 * 2/2003 Schoefthaler ....... G01P 15/0802
73/514.02
7,279,761 B2 * 10/2007 Acar ..................... B81B 3/0056
257/415

(Continued)

FOREIGN PATENT DOCUMENTS

DE  10 2006 020 521 A1  11/2007

OTHER PUBLICATIONS

European Patent Office, PCT Written Opinion of the International Search Authority, PCT/IB2014/062650, Jun. 27, 2014.*

(Continued)

*Primary Examiner* — Clayton E Laballe
*Assistant Examiner* — Kevin Butler
(74) *Attorney, Agent, or Firm* — Squire Patton Boggs (US) LLP

(57) ABSTRACT

The invention relates to a capacitive micromechanical sensor structure comprising a stator structure rigidly anchored to a substrate and a rotor structure movably anchored by means of spring structures to the substrate. The stator structure has a plurality of stator finger support beams and the rotor structure has a plurality of rotor finger support beams. Stator fingers along the stator finger support beam of the stator structure extend into rotor gaps along the rotor finger support beam of the rotor structure, and rotor fingers along the rotor finger support beam of the rotor structure extend into stator gaps along the stator finger support beam of the stator structure.

18 Claims, 11 Drawing Sheets

(56) References Cited

U.S. PATENT DOCUMENTS

| | | | |
|---|---|---|---|
| 2004/0231420 A1* | 11/2004 | Xie | B81B 3/0062 73/514.32 |
| 2005/0092107 A1* | 5/2005 | Eskridge | B81B 3/0062 73/862.626 |
| 2005/0126287 A1* | 6/2005 | Malametz | G01P 15/08 73/514.32 |
| 2005/0132805 A1* | 6/2005 | Park | G01P 15/125 73/514.32 |
| 2006/0054983 A1 | 3/2006 | Acar et al. | |
| 2006/0156819 A1* | 7/2006 | Robert | G01P 15/0802 73/514.32 |
| 2006/0201249 A1* | 9/2006 | Horning | H02N 1/008 73/504.14 |
| 2006/0272414 A1* | 12/2006 | Ayazi | B81C 1/00182 73/514.32 |
| 2007/0113653 A1* | 5/2007 | Nasiri | G01P 1/023 73/510 |
| 2007/0144258 A1* | 6/2007 | Chu | G01P 15/125 73/514.32 |
| 2007/0193355 A1* | 8/2007 | Axelrod | G01P 15/125 73/514.32 |
| 2008/0092651 A1* | 4/2008 | Menard | G01P 15/131 73/488 |
| 2008/0190204 A1* | 8/2008 | Danel | G01C 19/5755 73/514.32 |
| 2008/0196500 A1* | 8/2008 | Menard | G01P 15/125 73/514.18 |
| 2009/0260437 A1 | 10/2009 | Blomqvist | |
| 2009/0320596 A1 | 12/2009 | Classen et al. | |
| 2010/0050771 A1* | 3/2010 | Je | G01P 15/125 73/514.32 |
| 2010/0122579 A1* | 5/2010 | Hsu | G01P 15/125 73/514.32 |
| 2010/0326191 A1* | 12/2010 | Foster | G01P 15/125 73/514.32 |
| 2011/0147860 A1* | 6/2011 | Robert | G01P 15/0802 257/415 |
| 2011/0219876 A1* | 9/2011 | Kalnitsky | A63F 13/06 73/514.32 |
| 2014/0252509 A1* | 9/2014 | Merassi | B81B 3/0072 257/415 |
| 2015/0000403 A1* | 1/2015 | Liukku | G01P 15/125 73/510 |
| 2015/0316581 A1* | 11/2015 | Liukku | G01P 15/125 73/514.32 |

OTHER PUBLICATIONS

Ibarra-Villegas et al., 'Design of Capacitive MEMS transverse-comb accelerometers with test hardware', Mar. 2013, Superficies y Vacío, 26(1) 4-12.*

Jason W. Weigold et al., "Design and Fabrication of Submicrometer, Single Crystal Si Accelerometer", Journal of Microelectromechanical Systems, vol. 10, No. 4, Dec. 2001, pp. 518-524.

International Search Report application No. PCT/IB2014/062650 dated Oct. 7, 2014.

Finnish Search Report dated Apr. 22, 2014 corresponding to Finnish Patent Application No. 20135712.

* cited by examiner

CAPACITIVE MICROMECHANICAL SENSOR STRUCTURE AND MICROMECHANICAL ACCELEROMETER

BACKGROUND

Field

The invention relates to a capacitive micromechanical sensor structure. The invention relates also to a micromechanical accelerometer comprising two capacitive micromechanical sensor structures.

Description of the Related Art

In-plane acceleration detection in MEMS accelerometer is usually done with closing gap combs (parallel plate capacitor) or with linear combs (longitudinal capacitor).

In closing gap combs the capacitance behavior of the comb fingers can be approximately modeled by a parallel plate capacitor with varying finger gap and constant area according to equation (1)

$$C = \epsilon \frac{A}{d-x} + C_f \quad (1)$$

where C is capacitance, $\epsilon$ is permittivity, A finger area, d finger gap, x finger displacement and $C_f$ static stray capacitance. Comb fingers move in measurement mode closer to each other eventually causing the gap between the fingers to close.

In linear combs comb fingers move parallel to each other and capacitance behavior can be modeled by a parallel plate capacitor with varying area and constant finger gap according to equation (2)

$$C = \epsilon \frac{h(l+x)}{d} + C_f \quad (2)$$

where l is finger overlap length and h finger height.

Closing gap combs and linear combs have very different advantages and disadvantages. A closing gap comb can produce larger signals but a small gap between fingers makes the signal very nonlinear and it is hard to make an accelerometer that fulfills modern accelerometer requirements with finger side gaps under 2 micrometers. Also a process has to be able to manufacture a stopper gap with significantly smaller gap size than the measurement gap. Small finger side gaps cause reliability issues as electrical forces and mechanical sticking forces become close to returning spring forces. A linear comb, on the other hand, has smaller sensitivity with the same displacement, but the signal is linear. Linear combs also do not have pull-in effect in measurement direction and therefore sticking issues can be minimized.

SUMMARY

The object of the invention is to provide a micromechanical accelerometer structure that is robust against sticking, easy to manufacture and test, enables the use of high measurement voltage and maximizes linearity while maintaining high sensitivity and damping.

The proposed capacitive micromechanical sensor structure uses advantageous aspects of both closing gap and linear combs.

In the proposed capacitive micromechanical sensor structure the signal comes in significant part from the linear comb structure by varying the finger overlap length i.e. the capacitor area between rotor fingers of the rotor finger structure along at least one side of the rotor finger support beam and stator fingers of the stator finger support structure along at least one side of the stator finger support beam and from the closing gap comb structure by varying the fingertip gap i.e. the capacitor gap between rotor fingertips of the rotor finger structure along at least one side of the rotor finger support beam and the stator finger support beam and/or the capacitor gap between stator fingertips of the stator finger structure along at least one side of the stator finger support beam and the rotor finger support beam.

This novel design also provides for a new tunable parameter (fingertip gap) to tune the sensor performance. In the proposed capacitive micromechanical sensor structure sensitivity can be maintained in a level comparable to closing gap combs by keeping the fingertip gap between the rotor fingers of the rotor finger structure along said at least one side of the rotor finger support beam and the stator finger support beam and/or by keeping the fingertip gap between the stator fingers of the stator finger structure along said at least one side of the stator finger support beam and the rotor finger support beam small, such as 1 to 3 times the finger side gap between rotor fingers of the rotor finger structure along said at least one side of the rotor finger support beam and stator fingers of the stator finger support structure along said at least one side of the stator finger support beam. The result of this is that the sensitivity may increase by 20-50 percent compared to a pure linear comb. It also gives new possibilities to maximize linearity without lowering parasitic resonance frequencies.

By correctly choosing the fingertip gap, the finger side gap and the stopper gap, provided that the capacitive micromechanical sensor structure is provided with stopper bumps, it is possible to manufacture a micromechanical sensor that has no pull-in effect in measurement direction. This decreases the risk of sticking considerably and enables the use of higher measurement voltage in ASIC that makes ASIC design easier. Elimination of the pull-in effect increases testing robustness and reliability during operation.

The proposed micromechanical accelerometer structure can be used to optimize damping and noise. High damping in accelerometer increases noise but makes sensor more robust against vibrations. High gas damping in closing comb structures can be a problem especially with very small finger side gaps. In closing gap combs it is necessary to use a stopper gap with significantly smaller gap size than the measurement gap to avoid short-circuiting and sticking. This is the most demanding feature in the accelerometer design for lithography and DRIE processes. In the proposed capacitive micromechanical sensor structure the fingertip gap is preferably, but not necessarily, made larger than finger side gap. As a result of this the measurement direction stopper gap can be made equal to finger side gap so relaxing the aspect ratio requirement of the manufacturing process.

BRIEF DESCRIPTION OF THE DRAWINGS

In the following the invention will described in more detail by referring to the figures, of which

DETAILED DESCRIPTION

Figure 1:
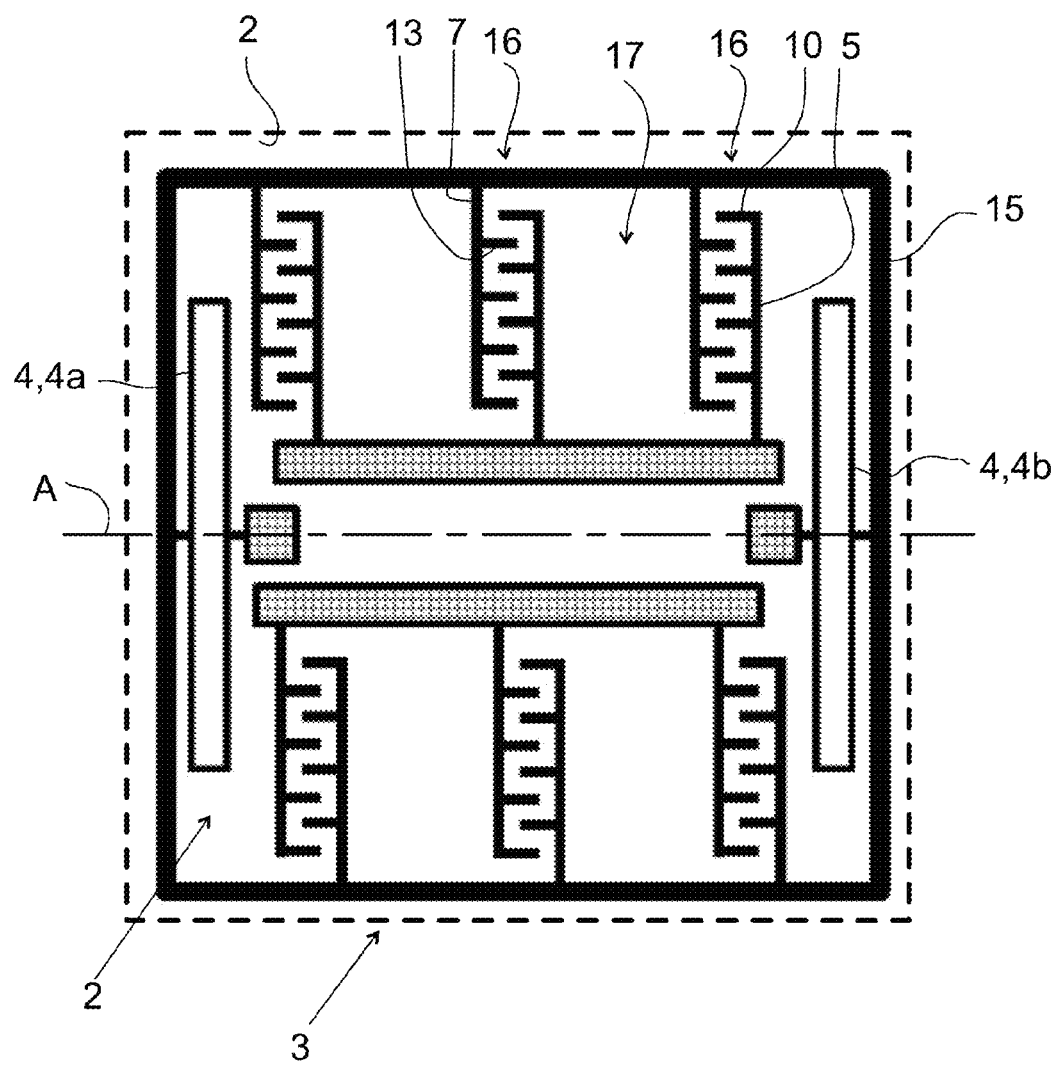
FIG. 1 shows a micromechanical accelerometer sensor structure according to a first embodiment.
Figure 2:
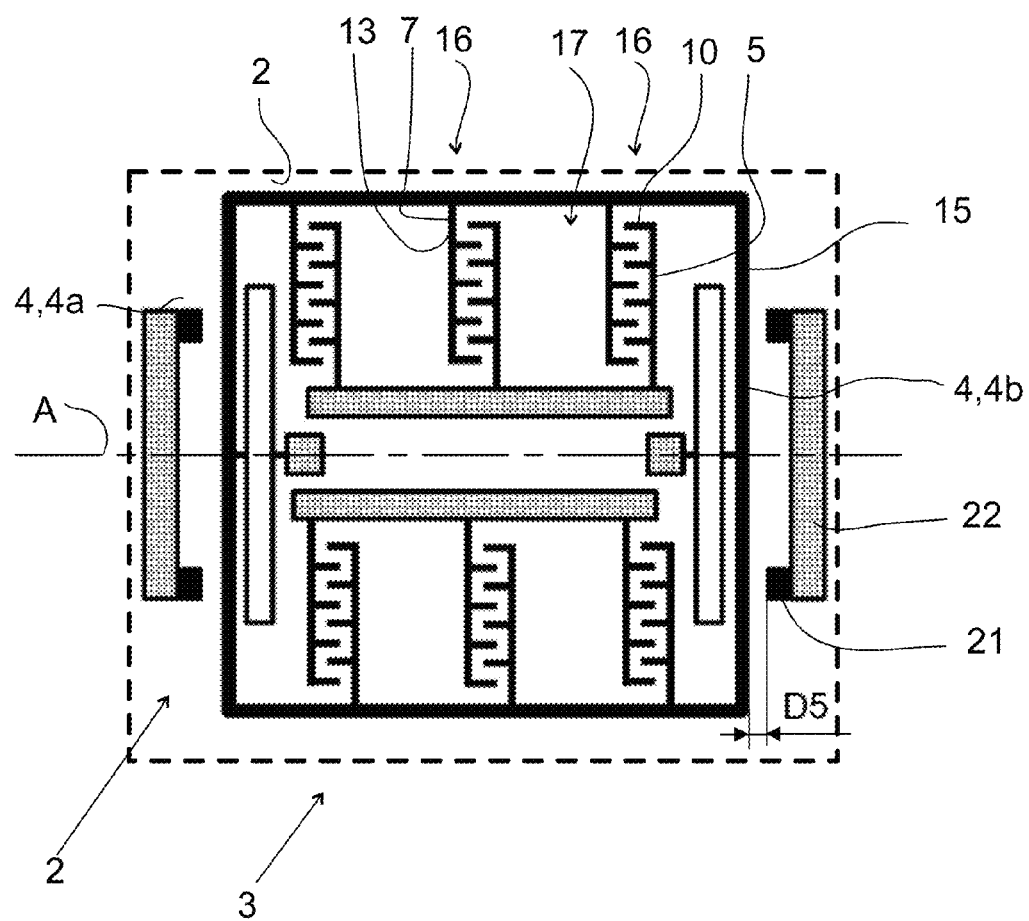
FIG. 2 shows a variant of the first embodiment shown in FIG. 1.
Figure 3:
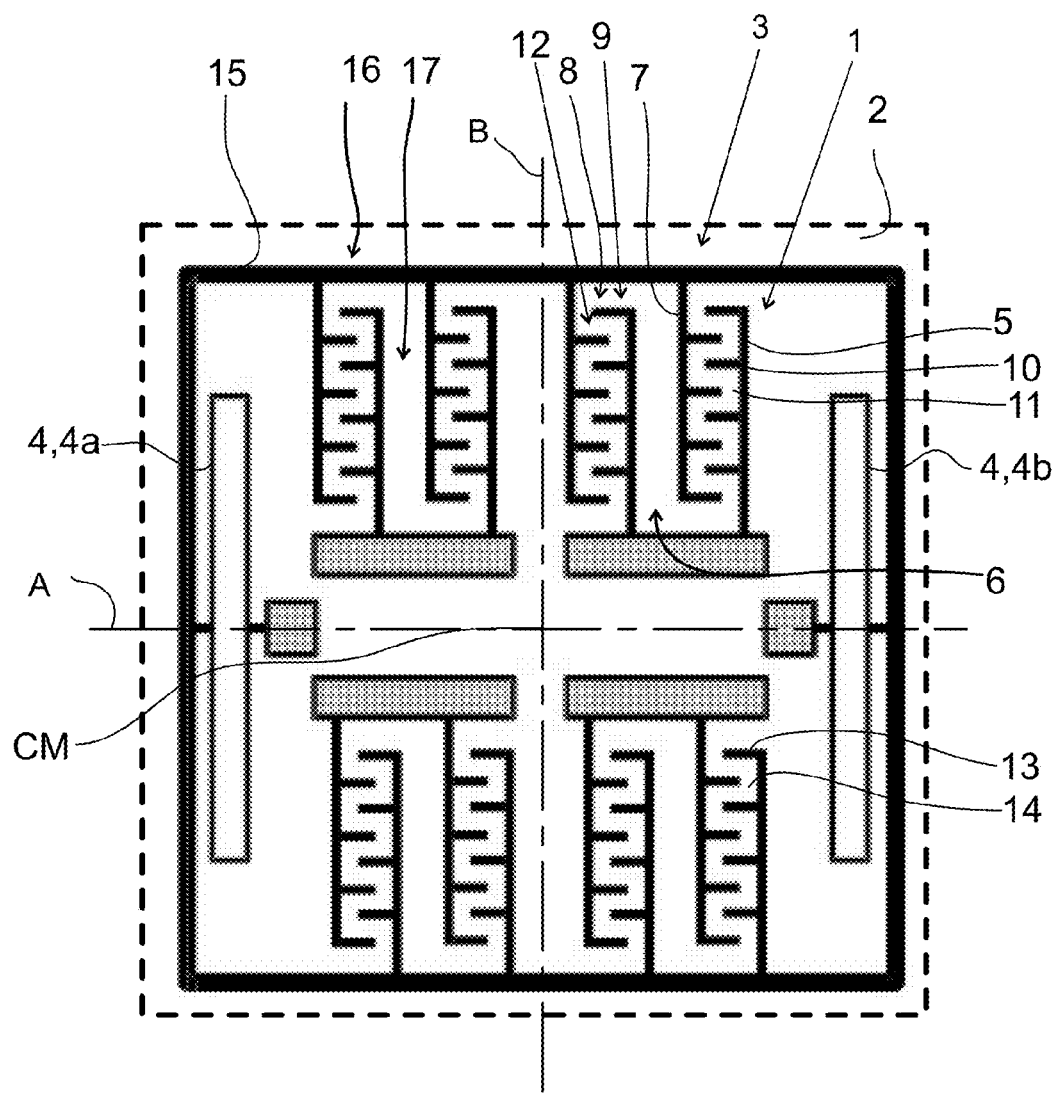
FIG. 3 shows a micromechanical accelerometer sensor structure according to a second embodiment.
Figure 4:
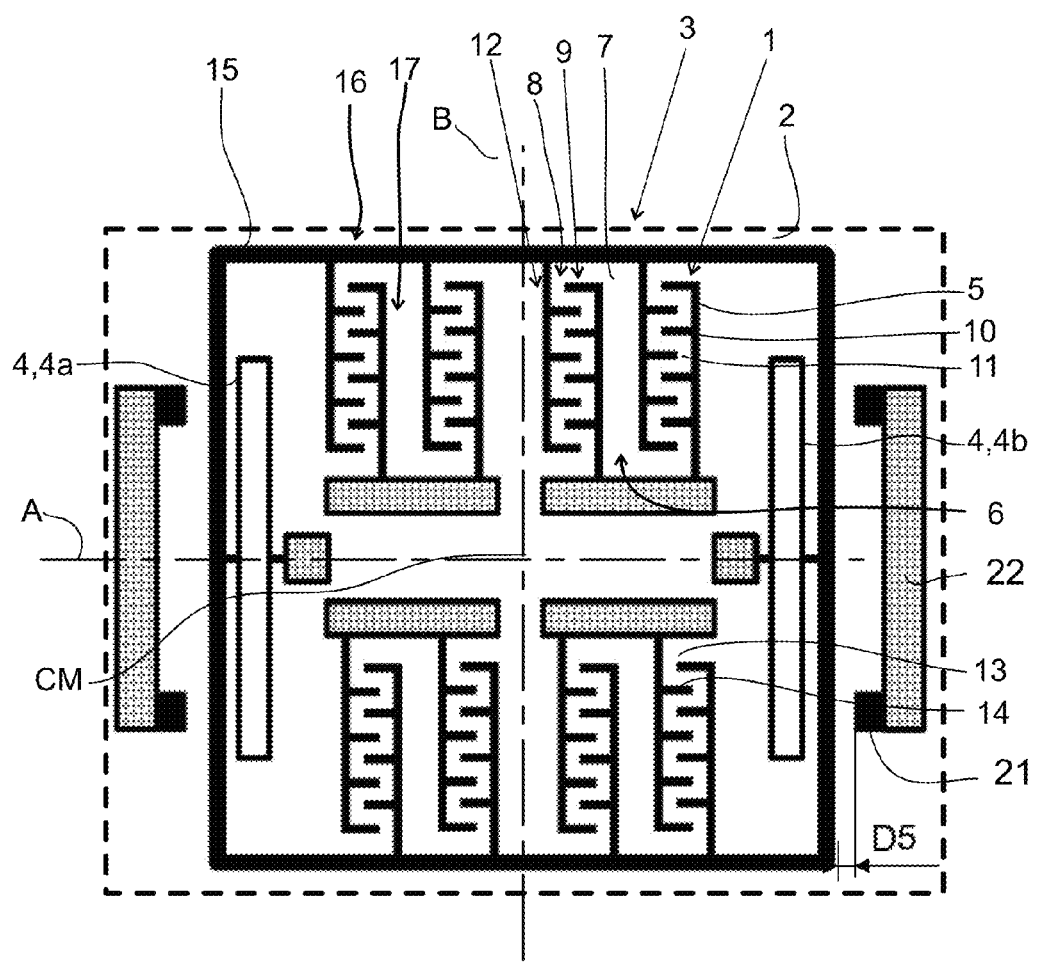
FIG. 4 shows a variant of the second embodiment shown in FIG. 3.
Figure 5:
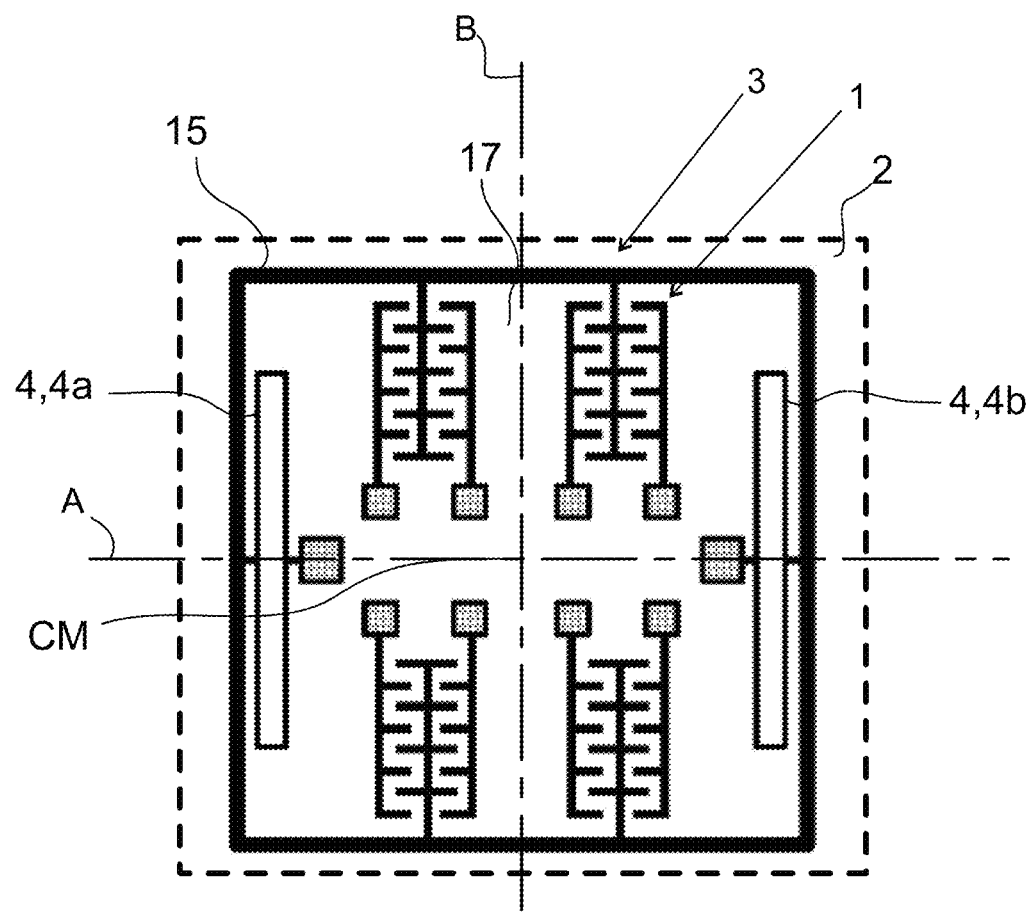
FIG. 5 shows a micromechanical accelerometer sensor structure according to a third embodiment.
Figure 6:
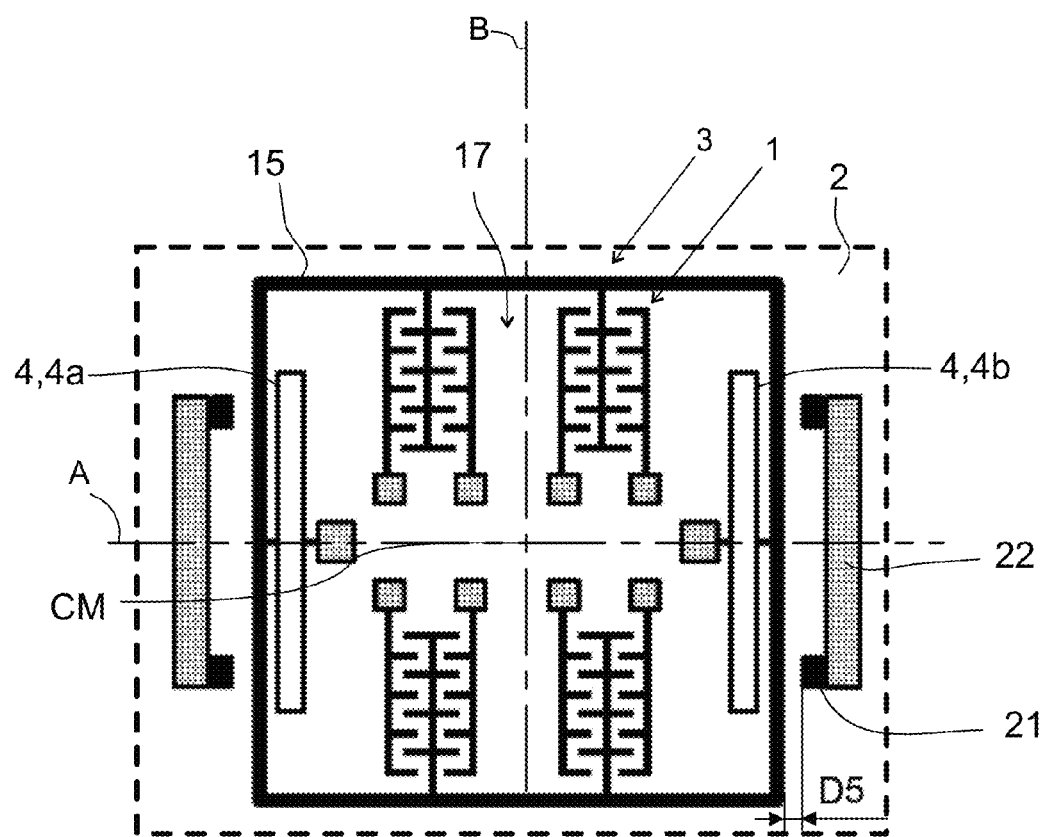
FIG. 6 shows a variant of the second embodiment shown in FIG. 5.

FIGS. 1 and 2 each show an embodiment of a capacitive micromechanical sensor structure. FIGS. 3 and 4 are detail views of capacitive micromechanical sensor structures. FIGS. 5 and 6 each show examples of a micromechanical accelerometer each comprising three micromechanical sensors.

First the capacitive micromechanical sensor structure and some preferred embodiments and variants thereof will be described in greater detail.

The capacitive micromechanical sensor structure comprises a stator structure 1 rigidly anchored to a substrate 2 and a rotor structure 3 movably anchored by means of spring structures 4; 4a, 4b to the substrate 2.

The capacitive micromechanical sensor structure may at least partly be fabricated out of a silicon substrate.

The stator structure 1 has a plurality of stator finger support beams 5.

In the embodiments shown in the figures, the capacitive micromechanical sensor structure has first spaces 6 between two adjacent stator finger support beams 5.

The rotor structure 3 has a plurality of rotor finger support beams 7.

In the embodiments shown in the figures, the capacitive micromechanical sensor structure has second spaces 8 between two adjacent rotor finger support beams 7.

In the embodiments shown in the figures, the capacitive micromechanical sensor structure, stator finger support beams 5 of the stator structure 1 extend into second spaces 8 of the rotor structure 3 and rotor finger support beams 7 of the rotor structure 3 extend into first spaces 6 of the stator structure 1.

The capacitive micromechanical sensor structure may have reflectional symmetry with respect to a first central axis A of the capacitive micromechanical sensor structure.

A stator finger support beam 5 of the stator structure 1 comprises a stator finger structure 9 along at least one side of the stator finger support beam 5. The stator finger structure 9 comprises a plurality of stator fingers 10 and stator gaps 11 between two adjacent stator fingers 10. The capacitive micromechanical sensor structure may comprise a stator finger support beam 5 of the stator structure 1 comprising a stator finger structure 9 along two opposite sides of the stator finger support beam 5, so that both stator finger structures 9 comprising a plurality of stator fingers 10 and stator gaps 11 between two adjacent stator fingers 10.

A rotor finger support beam 7 of the rotor structure 3 comprises a rotor finger structure 12 along at least one side of the rotor finger support beam 7. The rotor finger structure 12 comprises a plurality of rotor fingers 13 and rotor gaps 14 between two adjacent rotor fingers 13. The capacitive micromechanical sensor structure may comprise a rotor finger support beam 7 of the rotor structure 3 comprising a rotor finger structure 12 along two opposites side of the rotor finger support beam 7, so that both rotor finger structures 12 comprising a plurality of rotor fingers 13 and rotor gaps 14 between two adjacent rotor fingers 13.

Stator fingers 10 along the stator finger structure 9 extend into rotor gaps 14 along the rotor finger structure 12 and rotor fingers 13 along the rotor finger structure 12 extend into stator gaps 11 along the stator finger structure 9.

FIGS. 1 to 4 shows examples of capacitive micromechanical sensor structures, where all stator finger support beams 5 are provided with a stator finger structure 9 along a side of the stator finger support beam 5, and where all rotor finger support beams 7 are provided with a rotor finger structure 12 along a side of the rotor finger support beam 7.

FIGS. 5 and 6 shows examples of capacitive micromechanical sensor structures, where all stator finger support beams 5 are provided with a stator finger structure 9 along a side of the stator finger support beam 5, and where all rotor finger support beams 7 are provided with a rotor finger structure 12 along two sides of the rotor finger support beam 7.

If the capacitive micromechanical sensor structure has reflectional symmetry with respect to a first central axis A of the capacitive micromechanical sensor structure, the stator finger support beams 5 of the stator structure 1 and the rotor finger support beams 7 of the rotor structure 3 extend preferably, but not necessarily, perpendicularly with respect to the first central axis A of the capacitive micromechanical sensor structure, as is the situation in the embodiments shown in FIGS. 1 and 2.

The stator fingers 10 of the stator finger structures 9 of the stator finger support beams 5 of the stator structure 1 extend preferably, but not necessarily, perpendicularly from the stator finger support beams 5, and the rotor fingers 13 of the rotor finger structures 12 of the rotor finger support beams 7 of the rotor structure 3 extend preferably, but not necessarily, perpendicularly from the rotor finger support beams 7, as is the situation in the embodiments shown in FIGS. 1 and 2.

If the capacitive micromechanical sensor structure has reflectional symmetry with respect to a first central axis A of the capacitive micromechanical sensor structure, the stator fingers 10 of the stator finger structure 9 of the stator finger support beam 5 are preferably, but not necessarily, parallel with the first central axis A of the capacitive micromechanical sensor structure, and the rotor fingers 13 of the rotor finger structure 12 of the rotor finger support beams 7 are preferably, but not necessarily, parallel the first central axis A of the capacitive micromechanical sensor structure.

The capacitive micromechanical sensor structure may, as in the capacitive micromechanical sensor structure shown in FIG. 2, be reflectionally symmetrical with respect to a first central axis A of the capacitive micromechanical sensor structure and be reflectionally symmetrical with respect to a second central axis B of the capacitive micromechanical sensor structure, wherein the first central axis A of the capacitive micromechanical sensor structure and the second central axis B of the capacitive micromechanical sensor structure are perpendicular and cuts each other at a center of mass CM of the capacitive micromechanical sensor structure.

If the capacitive micromechanical sensor structure is, as in the capacitive micromechanical sensor structure shown in FIG. 2, symmetrical with respect to a first central axis A of the capacitive micromechanical sensor structure and symmetrical with respect to a second central axis B of the capacitive micromechanical sensor structure, the stator fingers 10 of the stator finger structure 9 and the rotor fingers 13 of the rotor finger structure 12 are preferably, but not necessarily, parallel with the first central axis A of the capacitive micromechanical sensor structure, and the rotor finger support beams 7 and the stator finger support beams 5 are preferably, but not necessarily, parallel with the second central axis B of the capacitive micromechanical sensor structure.

The capacitive micromechanical sensor structure comprises preferably, but not necessarily, a rotor frame 15 surrounding the stator structure(s) 1 and the rotor structure(s) 3, as is the situation in the embodiments shown in FIGS. 1 and 2. In such embodiments the rotor frame 15 is movably anchored to the substrate 2 by means of spring structures 4; 4a, 4b, and the rotor finger support beams 7 of the rotor structure 3 are rigidly connected to the rotor frame 15. In FIGS. 1 and 2 the rotor frame 15 is movably anchored to the substrate 2 by means of spring structures 4; 4a, 4b comprising a first spring structure 4a and a second spring structure 4b. The rotor frame 15 is arranged to have reflectional symmetry with respect to the center of mass CM of the capacitive micromechanical sensor structure. The rotor frame 15 comprises preferably, but not necessarily, as illustrated in FIGS. 1 and 2, a first stiff beam (not marked with a reference numeral), a second stiff beam (not marked with a reference numeral), a third stiff beam (not marked with a reference numeral), and a fourth stiff beam (not marked with a reference numeral) rigidly connected to each other at the ends of the stiff beams to form a rectangular-shaped frame. The rotor frame 15 is preferably, but not necessarily, as illustrated in FIGS. 1 and 2, movably anchored to the substrate 2 by means of a first spring structure 4a connected between the middle of the first stiff beam and the substrate 2 and by means of a second spring structure 4a connected between the middle of the second stiff beam that is parallel with the first stiff beam and the substrate 2.

Figure 7:
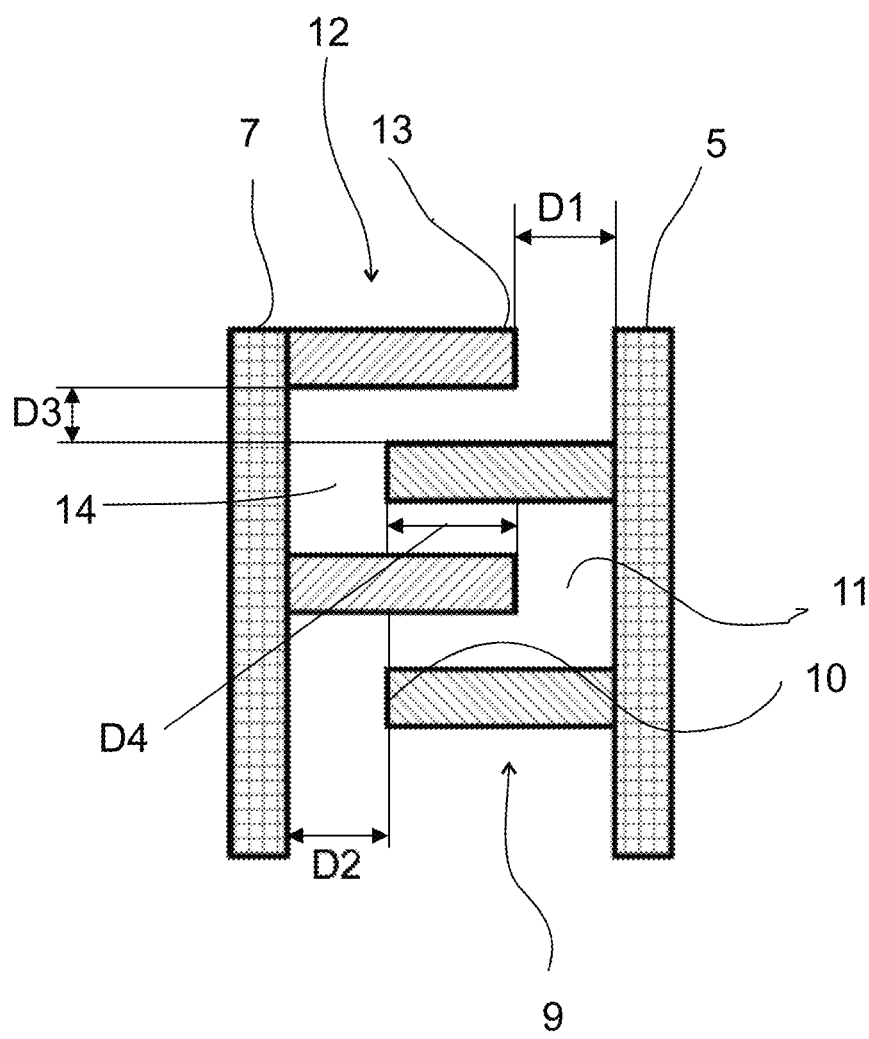
FIG. 7 is a detail view of the rotor structure along a side of a rotor finger support beam and of the stator structure along a side of a stator finger support beam.
Figure 8:
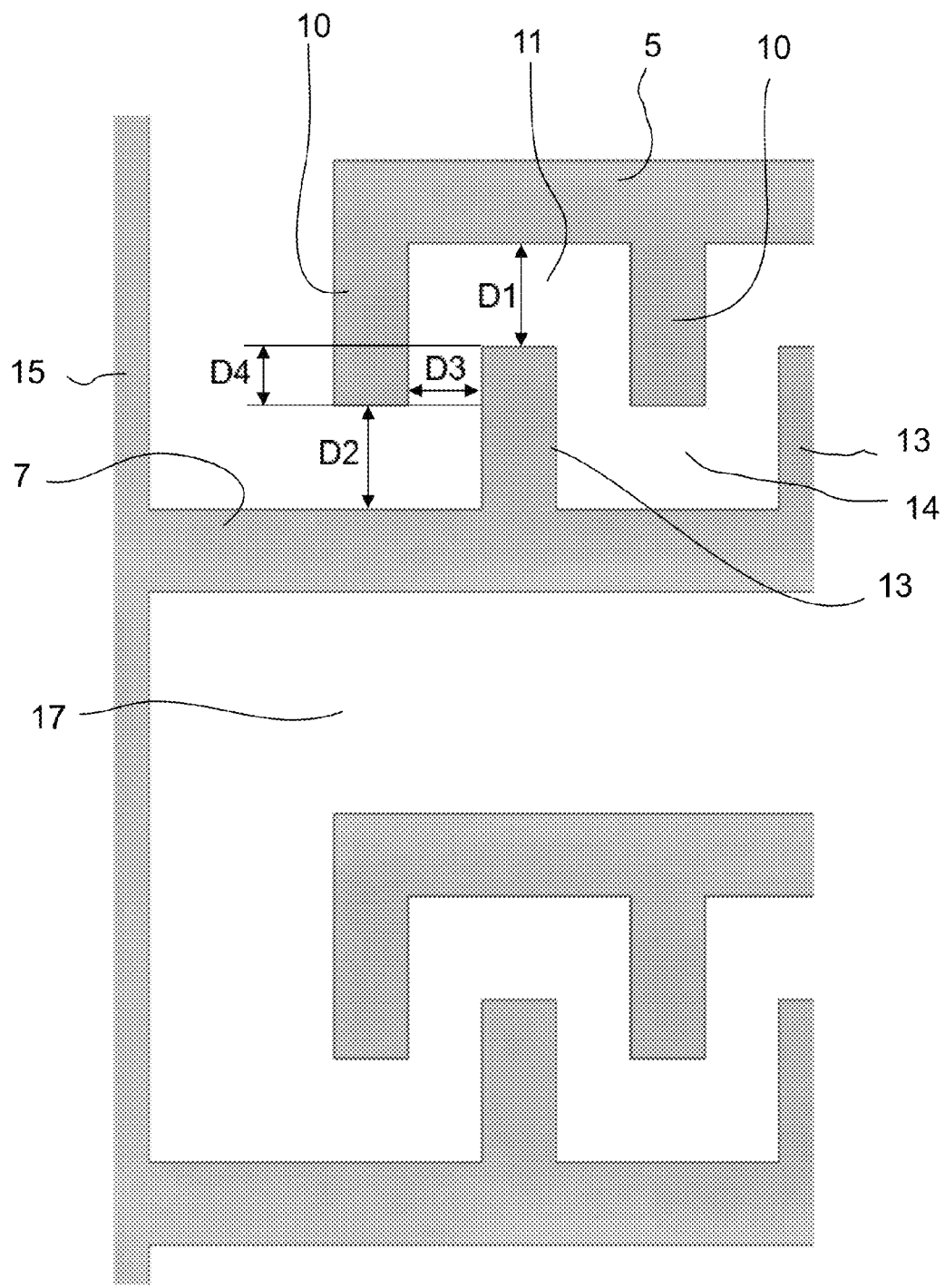
FIG. 8 is another detail view showing rotor structures along a side of rotor finger support beams and showing stator structures along a side of stator finger support beams.

The rotor structure 3 is preferably, but not necessarily, movably anchored at anchoring points (not marked with a reference numeral) to the substrate 2 by means of spring structures 4; 4a, 4b provided between the rotor structure 3 and the anchoring points in such way that the rotor structure 3 can be deflected at least in a direction parallel with the plane of the substrate 2 with respect to the stator structure 1, which said direction extends preferably, but not necessarily, along a first central axis A of the capacitive micromechanical sensor structure, so that the rotor fingertip gap D1 (see FIG. 7) between the rotor fingers 13 of the rotor finger structure 12 along the side of the rotor finger support beam 7 and the stator finger support beam 5 changes, and so that the stator fingertip gap D2 (see FIG. 7) between the stator fingers 10 of the stator finger structure 9 along the side of the stator finger support beam 5 and the rotor finger support beam 7 changes, and so that the finger overlap length D4 (see FIG. 7), which is the length the stator fingers 10 of the stator finger structure 9 extend into the rotor gaps 14 of the rotor finger structure 12, or alternatively which is the length the rotor fingers 13 of the rotor finger structure 12 extend into the stator gaps 11 of the stator finger structure 9 changes.

In FIGS. 1 and 2 the rotor frame 15 is movably anchored to the substrate 2 by means of spring structures 4; 4a, 4b comprising a first spring structure 4a and a second spring structure 4b so that the rotor frame 15 can be deflected at least in the direction along the first central axis A with respect to the stator structures 1 and parallel with the plane of the substrate 2 so that the rotor fingertip gap D1 between the rotor fingers 13 of the rotor finger structure 12 along the side of the rotor finger support beam 7 and the stator finger support beam changes, and so that the stator fingertip gap D2 between the stator fingers 10 of the stator finger structure 9 along the side of the stator finger support beam 5 and the rotor finger support beam 7 changes, and so that the finger overlap length D4, which is the length the stator fingers 10 of the stator finger structure 9 extend into the rotor gaps 14 of the rotor finger structure 12, or alternatively which is the length the rotor fingers 13 of the rotor finger structure 12 extend into the stator gaps 11 of the stator finger structure 9 changes.

The rotor structure 3 is preferably, but not necessarily, movably anchored to the substrate 2 by means of spring structures 4; 4a, 4b comprising a first spring structure 4a and a second spring structure 4b so that the first spring structure 4a and the second spring structure 4b is arranged at the first central axis A of the capacitive micromechanical sensor structure and symmetrically with respect to the first central axis A of the capacitive micromechanical sensor structure, as is the situation in the embodiments shown in FIGS. 1 and 2.

The spring structures 4; 4a, 4b comprise preferably, but not necessarily, at least one of the following: a seesaw type spring structure, an S-shaped spring element, a U-shaped spring element, and a folded spring element.

The stator finger support beams 5 of the stator finger structure 9 are preferably, but not necessarily, vertical comb electrodes.

The rotor finger support beams 7 of the rotor finger structure 12 are preferably, but not necessarily, vertical comb electrodes.

The stator fingers 10 of the stator finger support beam(s) 5 of the stator finger structure 9 are preferably, but not necessarily, vertical comb electrodes.

The rotor fingers 13 of the rotor finger support beam(s) 7 of the rotor finger structure 12 are preferably, but not necessarily, vertical comb electrodes.

The rotor finger structure 12 along said at least one side of the rotor finger support beam 7 can be designed and dimensioned in such way that the rotor fingers 13 of the rotor finger structure 12 are evenly distributed along said at least one side of the rotor finger support beam 7 and so that the width of the rotor gaps 14 of the rotor finger structure 12 is between 4.5 and 7.5 micrometers, for example 6 micrometers, and so that the width of the rotor fingers 13 of the rotor finger structure 12 is between 1.5 and 2.5 micrometers, for example 2 micrometers.

The rotor finger structure 12 along said at least one side of the rotor finger support beam 7 can be designed and dimensioned in such way that the rotor fingers 13 of the rotor finger structure 12 have a uniform design and so that the length of the rotor fingers 13 of the rotor finger structure 12 is between 4.0 and 10 micrometers, for example 6 micrometers.

The stator finger structure 9 along said at least one side of the stator finger support beam 5 can be designed and dimensioned in such way that the stator fingers 10 of the stator finger structure 9 are evenly distributed along said at least one side of the stator finger support beam 5 and so that the width of the stator gaps 11 of the stator finger structure 9 is between 4.5 and 7.5 micrometers and so that the width of the stator fingers 10 of the stator finger structure 9 is between 1.5 and 2.5 micrometers, for example 2 micrometers.

The stator finger structure 9 along said at least one side of the stator finger support beam 5 can be designed and dimensioned in such way that the stator fingers 10 of the stator finger structure 9 have a uniform design and so that the length of the stator fingers 10 of the stator finger structure 9 is between 4.0 and 10 micrometers, for example 6 micrometers.

In an unloaded position (with zero acceleration) of the micro-mechanical sensor structure, the stator fingertip gap D2 (see FIGS. 3 and 4) between the stator fingers 10 of the stator finger structure 9 along the side of the stator finger support beam 5 and the rotor finger support beam 7 is preferably, but not necessarily, between 2 and 6 micrometers, and is preferably about 3.5 micrometer.

In an unloaded position (with zero acceleration) of the micro-mechanical sensor structure, the rotor fingertip gap D1 (see FIGS. 3 and 4) between the rotor fingers 13 of the rotor finger structure 12 along the side of the rotor finger support beam 7 and the stator finger support beam 5 is preferably, but not necessarily, between 2 and 6 micrometers, and is preferably about 3.5 micrometers.

In an unloaded position (with zero acceleration) of the micro-mechanical sensor structure, the finger side gap D3 (see FIGS. 3 and 4) between the stator fingers 10 of the stator finger structure 9 along the side of the stator finger support beam 5 and the rotor fingers 13 of the rotor finger structure 12 along the side of the rotor finger support beam 7 is preferably, but not necessarily, between 1.5 and 2.5 micrometers, and is preferably about 2.0 micrometers.

The stator fingertip gap D2 (see FIGS. 3 and 4) between the stator fingers 10 of the stator finger structure 9 along the side of the stator finger support beam 5 and the rotor finger support beam 7 is preferably, but not necessarily, 1 to 3 times, preferably 1 to 2.5 times, more preferably 1 to 2 times, the finger side gap D3 (see FIGS. 3 and 4) between the stator fingers 10 of the stator finger structure 9 along the side of the stator finger support beam 5 and the rotor finger 13 of the rotor finger structure 12 along the side of the rotor finger support beam 7.

The rotor fingertip gap D1 (see FIGS. 3 and 4) between the rotor fingers 13 of the rotor finger structure 12 along the side of the rotor finger support beam 7 and the stator finger support beam 5 is preferably, but not necessarily, 1 to 3 times, preferably 1 to 2.5 times, more preferably 1 to 2 times, the finger side gap D3 (see FIGS. 3 and 4) between the stator fingers 10 of the stator finger structure 9 along the side of the stator finger support beam 5 and the rotor fingers 13 of the rotor finger structure 12 along the side of the rotor finger support beam 7.

In an unloaded position (with zero acceleration) of the micro-mechanical sensor structure, the finger overlap length D4 (see FIGS. 3 and 4) i.e. the length the stator fingers 10 of the stator finger structure 9 extend into the rotor gaps 14 of the rotor finger structure 12, or alternatively the length the rotor fingers 13 of the rotor finger structure 12 extend into the stator gaps 11 of the stator finger structure 9, is preferably, but not necessarily, between 1 and 4 micrometer, preferably between 2 and 3 micrometer, for example 2 micrometer. The finger overlap length D4 is preferably, but not necessarily, selected to be greater than the full-scale deflection of the rotor structure 3. Full-scale deflection meaning the deflection of the rotor structure 3 with maximum sensor acceleration.

A stator finger support beam 5 of the stator structure 1 comprising a stator finger structure 9 along a side of the stator finger support beam 5 and a rotor finger support beam 7 of the rotor structure 3 comprising a rotor finger structure 12 along a side of the rotor finger support beam 7 may, as in the embodiments shown in FIGS. 1 and 2, form a comb pair 16. In such embodiments the comb structure of the micro-mechanical sensor structure comprises a plurality of such comb pairs 16 and third spaces 17 between two adjacent comb pairs 16. In such embodiments the sides of the stator finger support beams 5 that faces the third spaces 17 are preferably, but not necessarily, free of stator fingers 10 such as free from a stator finger structure 9, and the sides of the rotor finger support beams 7 that faces the third spaces 17 are preferably, but not necessarily, free of rotor fingers 13 such as free of a rotor finger structure 12.

The width of such third spaces 17 is preferably, but not necessarily, between 5 and 10 micrometers, and being preferably about 7.5 micrometers.

The width of such third spaces 17 capacitive micromechanical sensor structure is preferably, but not necessarily, between 2 to 3 times finger side gap D3 (see FIGS. 3 and 4) between the stator fingers 10 of the stator finger structure 9 along the side of the stator finger support beam 5 and the rotor fingers 13 of the rotor finger structure 12 along the side of the rotor finger support beam 7.

The width of the third spaces 17 capacitive micromechanical sensor structure is preferably, but not necessarily, between 2 to 3 times the distance between the rotor fingers 13 of the rotor finger structure 12 along the rotor finger support beams 7 and a stator finger support beam 5.

The comb pairs 16 may, as shown in the embodiment illustrated in FIG. 3, be grouped in four groups of comb pairs 16 each comprising the same number of comb pairs 16 so that the groups of comb pairs 16 are disposed symmetrically with respect to a first central axis A of the capacitive micromechanical sensor structure and symmetrically with respect to a second central axis B of the capacitive micromechanical sensor structure and symmetrically with respect to the center of mass CM of the capacitive micromechanical sensor structure.

The capacitive micromechanical sensor structure is preferably, but not necessarily, symmetrical with respect to a first central axis A of the capacitive micromechanical sensor structure and symmetrical with respect to a second central axis B of the capacitive micromechanical sensor structure such that the first central axis A of the capacitive micromechanical sensor structure and the second central axis B of the capacitive micromechanical sensor structure are perpendicular and cuts each other at a center of mass CM of the capacitive micromechanical sensor structure.

The capacitive micromechanical sensor structure comprises preferably, but not necessarily, as in the embodiments shown in FIGS. 2, 4, and 6, stopper bumps 21 for preventing excess movement of the rotor structure 3 with respect to the stator structure 1 but allowing the rotor structure 3 to move in a direction along the first central axis A a distance corresponding a stopper gap D5 (see FIGS. 2, 4, and 6) of 1.0 to 2.5 micrometers, preferably 1.5 to 2.0 micrometers. A purpose of such stopper bumps 21 is to prevent the rotor structure(s) 3 for adhering to the stator structure(s) 1 and to prevent the rotor structure(s) 3 short-circuiting to the stator structure(s) 1 resulting in that the capacitive micromechanical sensor structure is unable to function. Additionally the stopper bumps 21 can be used to prevent a pull-in effect between the rotor structure(s) 3 and the stator structure(s) 1, in other words to keep the rotor structure(s) 3 at a such distance from the stator structure(s) 1 that no pull-in effect is created between the rotor structure(s) 3 and the stator structure(s) 1. The capacitive micromechanical sensor structure may for example as in the embodiments shown in FIGS. 2, 4, and 6 comprise a rotor frame 15 surrounding the stator structure 1 and the rotor structure 3, so that the rotor frame 15 is movably anchored to the substrate 2 by means of spring structures 4; 4a, 4b and so that the rotor finger support beams 7 of the rotor structure 3 is rigidly connected to the rotor frame 15 and so that the rotor frame 15 being arranged symmetrically with respect to a center of mass CM of the capacitive micromechanical sensor structure. In the embodiments shown in FIGS. 2, 4, and 6 the stopper bumps 21 may be configured to prevent excess movement of the rotor structure 3 with respect to the stator structure 1 by preventing excess movement of the rotor frame 15 with respect to the stator structure 1 but allowing the rotor frame 15 to move in a direction along the first central axis A a distance corresponding a stopper gap D5 (see FIGS. 2, 4, and 6) of 1.0 to 2.5 micrometers, preferably 1.5 to 2.0 micrometers.

The capacitive micromechanical sensor structure comprises preferably, but not necessarily, as in the embodiments shown in FIGS. 2, 4, and 6, stopper bumps 21 for preventing excess movement of the rotor structure 3 with respect to the stator structure 1 but allowing the rotor structure 3 to move in a direction along the first central axis A a distance corresponding a stopper gap D5 that is 0.5 to 1.5 times the finger side gap D3 between a stator fingers 10 of the stator finger structure 9 along the side of the stator finger support beam 5 and a rotor fingers 13 of the rotor finger structure 12 along the side of the rotor finger support beam 7. A purpose of such stopper bumps 21 is to prevent the rotor structure(s) 3 for adhering to the stator structure(s) 1 and to prevent the rotor structure(s) 3 short-circuiting to the stator structure(s) 1 resulting in that the capacitive micromechanical sensor structure is unable to function. Additionally the stopper bumps 21 can be used to prevent a pull-in effect between the rotor structure(s) 3 and the stator structure(s) 1, in other words to keep the rotor structure(s) 3 at a such distance from the stator structure(s) 1 that no pull-in effect is created between the rotor structure(s) 3 and the stator structure(s) 1. The capacitive micromechanical sensor structure may for example as in the embodiments shown in FIGS. 2, 4, and 6 comprise a rotor frame 15 surrounding the stator structure 1 and the rotor structure 3 so that the rotor frame 15 is movably anchored to the substrate 2 by means of spring structures 4; 4a, 4b and so that the rotor finger support beams 7 of the rotor structure 3 is rigidly connected to the rotor frame 15 and to that the rotor frame 15 is arranged symmetrically with respect to a center of mass CM of the capacitive micromechanical sensor structure. In such embodiment the stopper bumps 21 may be configured to prevent excess movement of the rotor structure 3 with respect to the stator structure 1 by preventing excess movement of the rotor frame 15 with respect to the stator structure 1 but allowing the rotor frame 15 to move in a direction along the first central axis A a distance corresponding a stopper gap D5 that is 0.5 to 1.5 times the finger side gap D3 between a stator fingers 10 of the stator finger structure 9 along the side of the stator finger support beam 5 and a rotor fingers 13 of the rotor finger structure 12 along the side of the rotor finger support beam 7. The stopper bumps 21 can for example have a sharp point.

Such stopper bumps 21 can for example be provided at any of the following; a rotor frame 21 of the capacitive micromechanical sensor structure, the stator structure 1 of the capacitive micromechanical sensor structure, the rotor structure 2 of the capacitive micromechanical sensor structure, and a separate stopper structure 22, as shown in FIGS. 2, 4, and 6, that is rigidly anchored to the substrate 2.

In the following a micromechanical accelerometer comprising two capacitive micromechanical sensor structures as described earlier and some preferred embodiments and variants of the micromechanical accelerometer will be described in greater detail.

The micromechanical accelerometer comprising two capacitive micromechanical sensor structures as described earlier comprises a substrate 2 having a plane (not marked with a reference numeral).

The two capacitive micromechanical sensor structures form a first micromechanical sensor 18 and a second micromechanical sensor 19 in the micromechanical accelerometer.

The first micromechanical sensor 18 is configured for measuring acceleration along an x-axis parallel to the plane of the substrate 2, and the second micromechanical sensor 19 is configured for measuring acceleration along a y-axis parallel to the plane of the substrate 2 and perpendicular to the x-axis.

The micromechanical accelerometer comprises a third central axis C. The first micromechanical sensor 18 is arranged in the micromechanical accelerometer so that the first central axis A1 of the first micromechanical sensor 18 and the third central axis C of the micromechanical accelerometer are parallel. The second micromechanical sensor 19 is arranged in the micromechanical accelerometer so that the first central axis A2 of the second micromechanical sensor 19 and the third central axis C of the micromechanical accelerometer are perpendicular.

Figure 9:
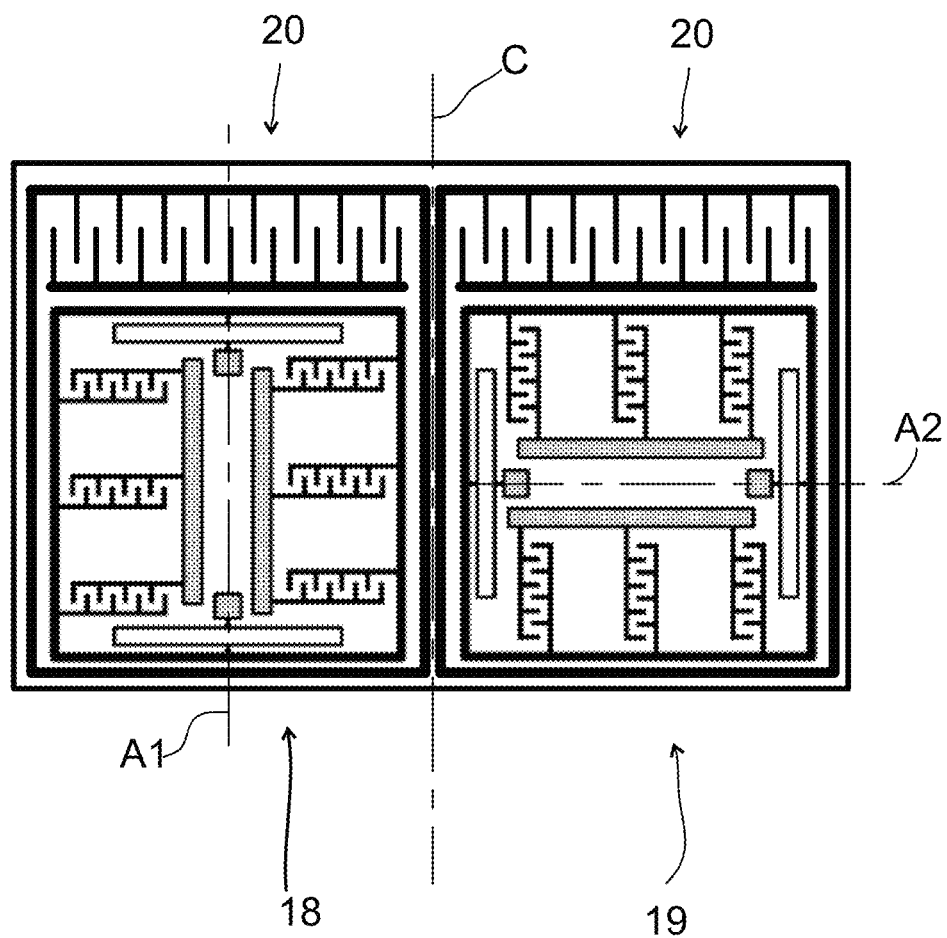
FIG. 9 shows a micromechanical accelerometer to a first embodiment.
Figure 10:
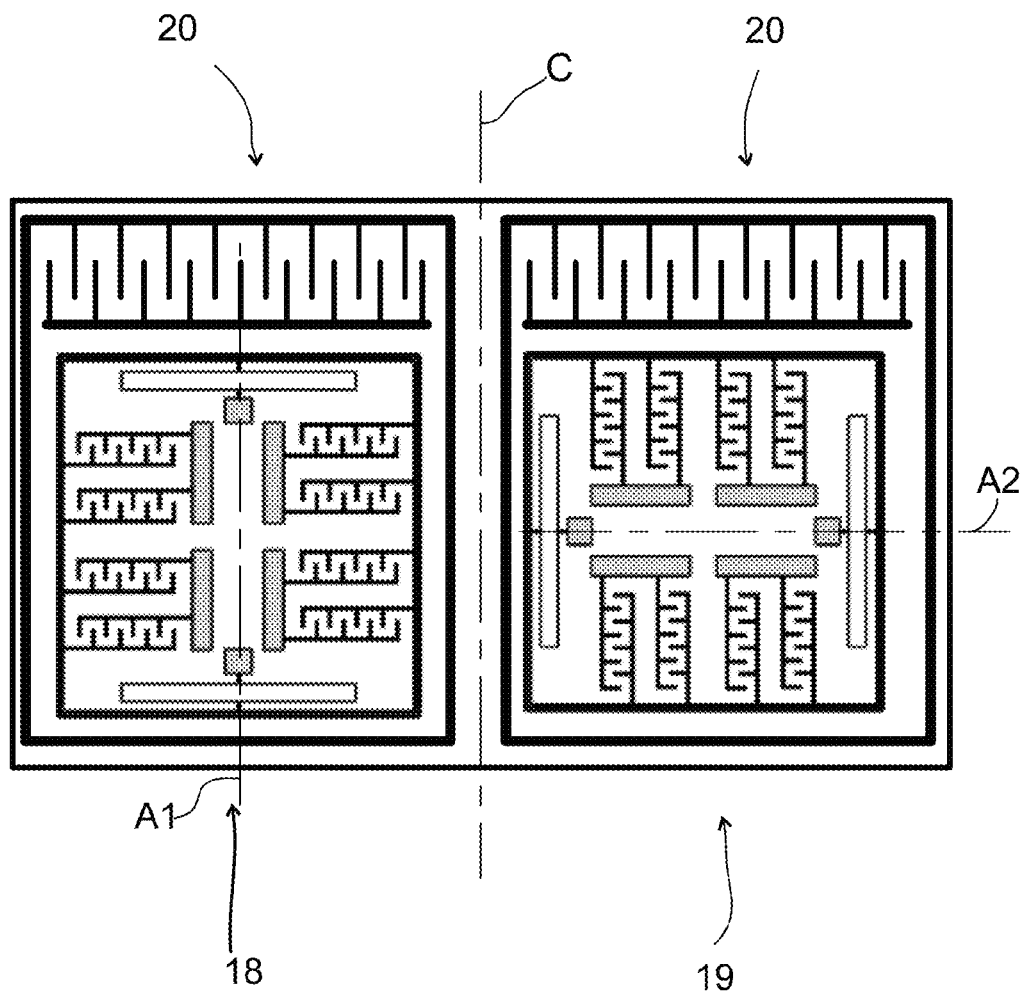
FIG. 10 shows a micromechanical accelerometer according to a second embodiment.
Figure 11:
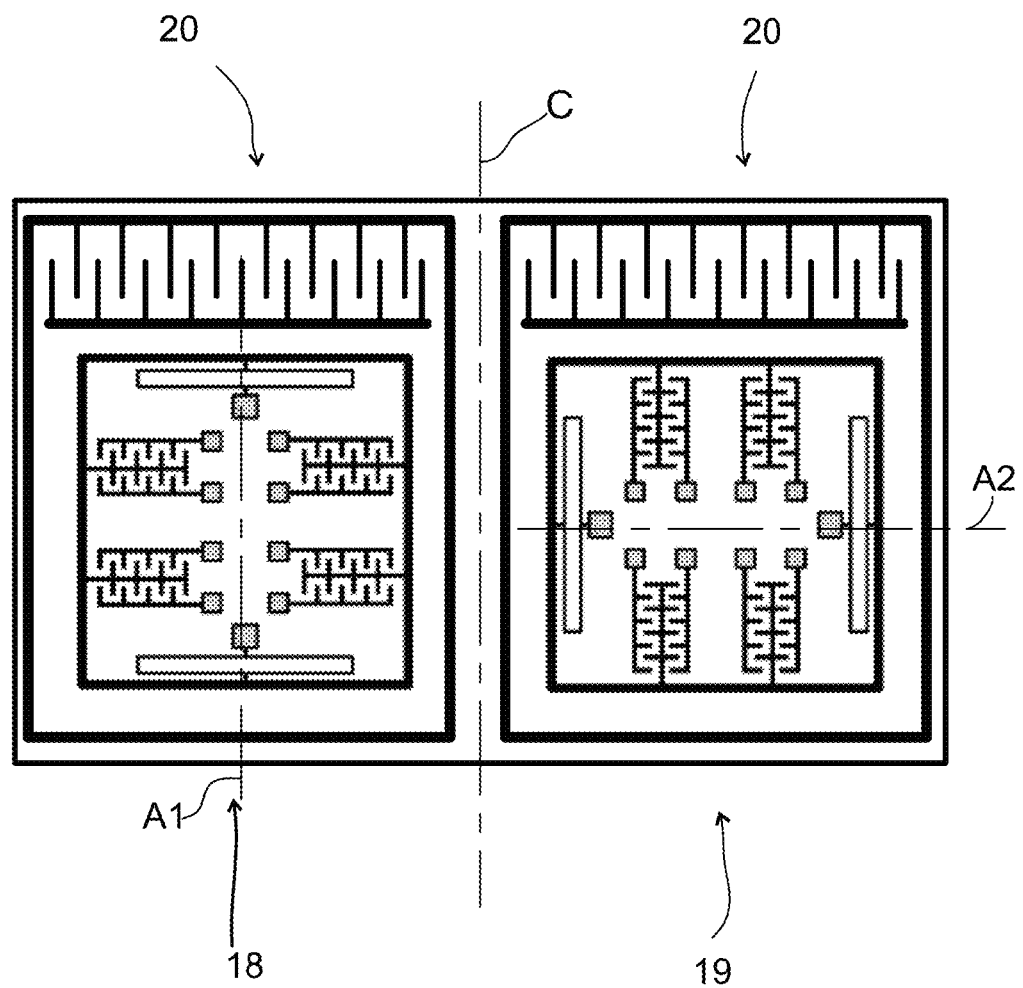
FIG. 11 shows a micromechanical accelerometer according to a third embodiment.

The micromechanical accelerometer comprises preferably, but not necessarily, as in the embodiments illustrated in FIGS. 9 to 11 at least one third micromechanical sensor 20 for measuring acceleration along a z-axis perpendicular to the plane of the substrate 2. A third micromechanical sensor 20 may, as in the embodiments illustrated in FIGS. 9 to 11, comprise a comb structure.

It is apparent to a person skilled in the art that as technology advanced, the basic idea of the invention can be implemented in various ways. The invention and its embodiments are therefore not restricted to the above examples, but they may vary within the scope of the claims.

LIST OF REFERENCE NUMERALS

1. Stator structure
2. Substrate
3. Rotor structure
4. Spring structure; 4a First spring structure-4b Second spring structure
5. Stator finger support beam
6. First space
7. Rotor finger support beam
8. Second space
9. Stator finger structure
10. Stator finger
11. Stator gap
12. Rotor finger structure
13. Rotor finger
14. Rotor gap
15. Rotor frame
16. Comb pair
17. Third space
18. First micromechanical sensor
19. Second micromechanical sensor
20. Third micromechanical sensor 21. Stopper bump
22. Stopper structure
D1 Rotor fingertip gap
D2 Stator fingertip gap
D3 Finger side gap
D4 Finger overlap length
D5 Stopper gap

The invention claimed is:

1. A capacitive micromechanical sensor structure comprising:
   a stator structure rigidly anchored to a substrate and a rotor structure movably anchored by spring structures to the substrate,
      the stator structure having a plurality of stator finger support beams,
      the rotor structure having a plurality of rotor finger support beams,
   a stator finger support beam of the stator structure comprising a stator finger structure along at least one side of the stator finger support beam, wherein the stator finger structure comprises a plurality of stator fingers and stator gaps between two adjacent stator fingers,
   a rotor finger support beam of the rotor structure comprising a rotor finger structure along at least one side of the rotor finger support beam, wherein the rotor finger structure comprises a plurality of rotor fingers and rotor gaps between two adjacent rotor fingers,
   stator fingers along the stator finger support beam of the stator structure extending into rotor gaps along the rotor finger support beam of the rotor structure,
   rotor fingers along the rotor finger support beam of the rotor structure extending into stator gaps along the stator finger support beam of the stator structure; characterized by
   a stator fingertip gap between the stator fingers of the stator finger structure and the rotor finger support beam being in unloaded state of the capacitive micromechanical sensor structure one to 2.5 times a finger side gap between the stator fingers of the stator finger structure and the rotor fingers of the rotor finger structure, and
   a rotor fingertip gap between the rotor fingers of the rotor finger structure and the stator finger support beam being in unloaded state of the capacitive micromechanical sensor structure one to 2.5 times the finger side gap between the stator fingers of the stator finger structure and the rotor fingers of the rotor finger structure, and
   the rotor structure being movably anchored to the substrate in such way that the rotor structure can be deflected at least parallel with the plane of the substrate so that the rotor fingertip gap between the rotor fingers along at least one side of the rotor finger support beam and the stator finger support beam changes, the stator fingertip gap between the stator fingers along at least one side of the stator finger support beam and the rotor finger support beam changes, and a finger overlap length changes, the finger overlap length being the length the stator fingers of the stator finger structure extend into the rotor gaps of the rotor finger structure, or alternatively the length the rotor fingers of the rotor finger structure extend into the stator gaps of the stator finger structure, and
   wherein stopper bumps configured to prevent excess movement of the rotor structure with respect to the stator structure but allowing the rotor structure to move in two opposite directions a distance corresponding to a stopper gap that is
      greater than 0.25 times the finger side gap between stator fingers of the stator finger structure along the side of the stator finger support beam and a rotor finger of the rotor finger structure along the side of the rotor finger support beam, and
      less than the rotor fingertip gap and less than the stator fingertip gap.

2. The capacitive micromechanical sensor structure according to claim 1, wherein the stator finger support beam of the stator structure comprises a stator finger structure along two opposite sides of the stator finger support beam, wherein each stator finger structure comprises a plurality of stator fingers and stator gaps between two adjacent stator fingers.

3. The capacitive micromechanical sensor structure according to claim 1, wherein a rotor finger support beam of the rotor structure comprises a rotor finger structure along two opposites side of the rotor finger support beam, wherein each rotor finger structure comprises a plurality of rotor fingers and rotor gaps between two adjacent rotor fingers.

4. The capacitive micromechanical sensor structure according to claim 1, wherein
   the stator fingers of the stator finger structure of the stator finger support beam extend perpendicularly from the stator finger support beam, and
   the rotor fingers of the rotor finger structure of the rotor finger support beams extend perpendicularly from a rotor finger support beam.

5. The capacitive micromechanical sensor structure according to claim 1, wherein the capacitive micromechanical sensor structure has reflectional symmetry with respect to a first central axis of the capacitive micromechanical sensor structure.

6. The capacitive micromechanical sensor structure according to claim 5, wherein the stator finger support beams of the stator structure and the rotor finger support beams of the rotor structure extend perpendicularly with respect to the first central axis of the capacitive micromechanical sensor structure.

7. The capacitive micromechanical sensor structure according to claim 5, wherein
   the stator fingers of the stator finger structure of the stator finger support beam are parallel with the first central axis of the capacitive micromechanical sensor structure, and
   the rotor fingers of the rotor finger structure of the rotor finger support beams are parallel with the first central axis of the capacitive micromechanical sensor structure.

8. The capacitive micromechanical sensor structure according to claim 5, wherein
   the rotor structure is movably anchored to the substrate by spring structures comprising a first spring structure and a second spring structure, and
   the first spring structure and the second spring structure are disposed at a first central axis of the capacitive micromechanical sensor structure, and to have reflectional symmetry with respect to a second central axis of the capacitive micromechanical sensor structure.

9. The capacitive micromechanical sensor structure according to claim 1, wherein
   the capacitive micromechanical sensor structure has reflectional symmetry with respect to a first central axis of the capacitive micromechanical sensor structure and reflectional symmetry with respect to a second central axis of the capacitive micromechanical sensor structure, and the first central axis of the capacitive micromechanical sensor structure and the second central axis of the capacitive micromechanical sensor structure are perpendicular and cutting each other at a center of mass CM of the capacitive micromechanical sensor structure.

10. The capacitive micromechanical sensor structure according to claim 9, wherein
the stator finger support beams of the stator structure and the rotor finger support beams of the rotor structure are parallel with the second central axis of the capacitive micromechanical sensor structure, and
the rotor fingers of the rotor fingers structure and the stator fingers of the stator finger structure are parallel with the first central axis of the capacitive micromechanical sensor structure.

11. The capacitive micromechanical sensor structure according to claim 1, wherein
the capacitive micromechanical sensor structure comprises a rotor frame surrounding the stator structure and the rotor structure,
the rotor frame is movably anchored to the substrate by spring structures,
the rotor finger support beams of the rotor structure are rigidly connected to the rotor frame, and
the rotor frame is arranged symmetrically with respect to a center of mass of the capacitive micromechanical sensor structure.

12. The capacitive micromechanical sensor structure according to claim 1, wherein
the stator finger support beams of the stator finger structure are vertical comb electrodes,
the rotor finger support beams of the rotor finger structure are vertical comb electrodes,
the stator fingers of the stator finger support beams of the stator finger structure are vertical comb electrodes, and
the rotor fingers of the rotor finger support beams of the rotor finger structure are vertical comb electrodes.

13. The capacitive micromechanical sensor structure according to claim 1, wherein
the stator finger support beam comprises a stator finger structure along a side of the stator finger support beam, and the rotor finger support beam comprising a rotor finger structure along a side of the rotor finger support beam, forming a comb pair,
the comb structure of the capacitive micromechanical sensor structure comprises a plurality of such comb pairs, and
third spaces between two adjacent comb pairs.

14. The capacitive micromechanical sensor structure according to claim 13, wherein
the sides of the stator finger support beams that face a third space are free of a stator finger structure, and
the sides of the rotor finger support beams that face a third space are free of a rotor finger structure.

15. The capacitive micromechanical sensor structure according to claim 13, wherein
the capacitive micromechanical sensor structure has reflectional symmetry with respect to a first central axis of the capacitive micromechanical sensor structure and reflectional symmetry with respect to a second central axis of the capacitive micromechanical sensor structure, the first central axis of the capacitive micromechanical sensor structure and the second central axis of the capacitive micromechanical sensor structure are perpendicular and cutting each other at a center of mass CM of the capacitive micromechanical sensor structure,
the comb pairs are grouped in four groups of comb pairs each comprising the same number of comb pairs, and
the groups of comb pairs are disposed in reflectional symmetry with respect to the first central axis of the capacitive micromechanical sensor structure, with respect to the second central axis of the capacitive micromechanical sensor structure and with respect to the center of mass of the capacitive micromechanical sensor structure.

16. A micromechanical accelerometer comprising two capacitive micromechanical sensor structures according to claim 1, wherein
the micromechanical accelerometer comprises a substrate having a plane,
said two capacitive micromechanical sensor structures form a first micromechanical sensor and a second micromechanical sensor in the micromechanical accelerometer,
the first micromechanical sensor is configured to measure acceleration along an x-axis parallel to the plane of the substrate, and wherein
the second micromechanical sensor is configured to measure acceleration along an y-axis parallel to the plane of the substrate and perpendicular to the x-axis.

17. A micromechanical accelerometer, comprising:
two capacitive micromechanical sensor structures,
wherein each of the capacitive micromechanical sensor structures comprises
a stator structure rigidly anchored to a substrate and a rotor structure movably anchored by spring structures to the substrate,
the stator structure having a plurality of stator finger support beams,
the rotor structure having a plurality of rotor finger support beams,
a stator finger support beam of the stator structure comprising a stator finger structure along at least one side of the stator finger support beam, wherein the stator finger structure comprises a plurality of stator fingers and stator gaps between two adjacent stator fingers,
a rotor finger support beam of the rotor structure comprising a rotor finger structure along at least one side of the rotor finger support beam, wherein the rotor finger structure comprises a plurality of rotor fingers and rotor gaps between two adjacent rotor fingers,
stator fingers along the stator finger support beam of the stator structure extending into rotor gaps along the rotor finger support beam of the rotor structure,
rotor fingers along the rotor finger support beam of the rotor structure extending into stator gaps along the stator finger support beam of the stator structure; characterized by
a stator fingertip gap between the stator fingers of the stator finger structure and the rotor finger support beam being in unloaded state of the capacitive micromechanical sensor structure one to three times a finger side gap between the stator fingers of the stator finger structure and the rotor fingers of the rotor finger structure, and a rotor fingertip gap between the rotor fingers of the rotor finger structure and the stator finger support beam being in unloaded state of the capacitive micromechanical sensor structure one to three times the finger side gap between the stator fingers of the stator finger structure and the rotor fingers of the rotor finger structure, and the rotor structure being movably anchored to the substrate in such way that the rotor structure can be deflected at least parallel with the plane of the substrate so that the rotor fingertip gap between the rotor fingers along at least one side of the rotor finger support beam and the stator finger support beam changes, the stator fingertip gap between the stator fingers along at least one side of the stator finger support beam and the rotor finger support beam changes, and a finger overlap length changes, the finger overlap length being the length the stator fingers of the stator finger structure extend into the rotor gaps of the rotor finger structure, or alternatively the length the rotor fingers of the rotor finger structure extend into the stator gaps of the stator finger structure, wherein the micromechanical accelerometer further comprises a substrate having a plane,
    said two capacitive micromechanical sensor structures form a first micromechanical sensor and a second micromechanical sensor in the micromechanical accelerometer,
    the first micromechanical sensor is configured to measure acceleration along an x-axis parallel to the plane of the substrate, and
    the second micromechanical sensor is configured to measure acceleration along an y-axis parallel to the plane of the substrate and perpendicular to the x-axis, wherein the micromechanical accelerometer further comprises a third central axis C, wherein the first micromechanical sensor is configured in the micromechanical accelerometer so that a first central axis of the first micromechanical sensor and the third central axis C of the micromechanical accelerometer are parallel, and wherein the second micromechanical sensor is configured in the micromechanical accelerometer so that a first central axis of the second micromechanical sensor and the third central axis C of the micromechanical accelerometer are perpendicular.

18. A micromechanical accelerometer, comprising:
two capacitive micromechanical sensor structures,
wherein each of the capacitive micromechanical sensor structures comprises
    a stator structure rigidly anchored to a substrate and a rotor structure movably anchored by spring structures to the substrate,
    the stator structure having a plurality of stator finger support beams,
    the rotor structure having a plurality of rotor finger support beams,
    a stator finger support beam of the stator structure comprising a stator finger structure along at least one side of the stator finger support beam, wherein the stator finger structure comprises a plurality of stator fingers and stator gaps between two adjacent stator fingers,
    a rotor finger support beam of the rotor structure comprising a rotor finger structure along at least one side of the rotor finger support beam, wherein the rotor finger structure comprises a plurality of rotor fingers and rotor gaps between two adjacent rotor fingers,
    stator fingers along the stator finger support beam of the stator structure extending into rotor gaps along the rotor finger support beam of the rotor structure,
    rotor fingers along the rotor finger support beam of the rotor structure extending into stator gaps along the stator finger support beam of the stator structure; characterized by a stator fingertip gap between the stator fingers of the stator finger structure and the rotor finger support beam being in unloaded state of the capacitive micromechanical sensor structure one to three times a finger side gap between the stator fingers of the stator finger structure and the rotor fingers of the rotor finger structure, and a rotor fingertip gap between the rotor fingers of the rotor finger structure and the stator finger support beam being in unloaded state of the capacitive micromechanical sensor structure one to three times the finger side gap between the stator fingers of the stator finger structure and the rotor fingers of the rotor finger structure, and the rotor structure being movably anchored to the substrate in such way that the rotor structure can be deflected at least parallel with the plane of the substrate so that the rotor fingertip gap between the rotor fingers along at least one side of the rotor finger support beam and the stator finger support beam changes, the stator fingertip gap between the stator fingers along at least one side of the stator finger support beam and the rotor finger support beam changes, and a finger overlap length changes, the finger overlap length being the length the stator fingers of the stator finger structure extend into the rotor gaps of the rotor finger structure, or alternatively the length the rotor fingers of the rotor finger structure extend into the stator gaps of the stator finger structure, wherein the micromechanical accelerometer further comprises a substrate having a plane,
    said two capacitive micromechanical sensor structures form a first micromechanical sensor and a second micromechanical sensor in the micromechanical accelerometer,
    the first micromechanical sensor is configured to measure acceleration along an x-axis parallel to the plane of the substrate, and
    the second micromechanical sensor is configured to measure acceleration along an y-axis parallel to the plane of the substrate and perpendicular to the x-axis, and wherein the micromechanical accelerometer further comprises at least one third micromechanical sensor for measuring acceleration along an z-axis that is perpendicular to the plane of the substrate and perpendicular to the x-axis and to the y-axis.

\* \* \* \* \*